(12) United States Patent
Ota et al.

(10) Patent No.: US 7,359,021 B2
(45) Date of Patent: Apr. 15, 2008

(54) DISPLAY PANEL AND METHOD FOR FABRICATING THE SAME

(75) Inventors: Yoshifumi Ota, Nara (JP); Toshiyuki Yoshimizu, Kyoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 205 days.

(21) Appl. No.: 10/740,799

(22) Filed: Dec. 22, 2003

(65) Prior Publication Data

US 2004/0141141 A1 Jul. 22, 2004

(30) Foreign Application Priority Data

Dec. 26, 2002 (JP) ............................. 2002-377431
Jan. 27, 2003 (JP) ............................. 2003-017166

(51) Int. Cl.
*G02F 1/1335* (2006.01)
(52) U.S. Cl. ...................................... 349/137; 349/153
(58) Field of Classification Search ................ 349/137, 349/150
See application file for complete search history.

(56) References Cited

U.S. PATENT DOCUMENTS

| 6,033,743 | A | * | 3/2000 | Suzuki et al. ............... 428/1.31 |
| 6,548,177 | B2 | * | 4/2003 | Hieda et al. ................. 428/441 |
| 6,642,976 | B2 | * | 11/2003 | Umemoto et al. ............ 349/65 |
| 6,693,746 | B1 | * | 2/2004 | Nakamura et al. .......... 359/580 |
| 6,738,123 | B1 | * | 5/2004 | Takahashi et al. .......... 349/152 |
| 7,005,794 | B2 | * | 2/2006 | Watanabe et al. ........... 313/489 |
| 7,166,352 | B2 | * | 1/2007 | Watanabe et al. ........... 428/220 |
| 7,167,222 | B2 | * | 1/2007 | Inoue et al. ................. 349/112 |
| 2001/0053438 | A1 | | 12/2001 | Nishida et al. |

FOREIGN PATENT DOCUMENTS

| JP | 52-022897 | 2/1977 |
| JP | 61-183152 | 8/1986 |
| JP | 06340029 | 12/1994 |
| JP | 2001113631 | 10/1999 |
| JP | 2001162721 | 12/1999 |
| JP | 2002297054 | 3/2001 |
| JP | 2002-072905 | 3/2002 |
| JP | 2002-296576 | 10/2002 |

* cited by examiner

*Primary Examiner*—David Nelms
*Assistant Examiner*—David Y. Chung
(74) *Attorney, Agent, or Firm*—Nixon & Vanderhye P.C.

(57) ABSTRACT

The display panel of this invention includes a pair of glass substrates each with a thickness not less than 0.15 mm and not more than 0.3 mm and a sealing material for bonding the pair of glass substrates to each other. A resin layer is formed on the outer face of at least one of the pair of glass substrates.

8 Claims, 14 Drawing Sheets

DISPLAY PANEL AND METHOD FOR FABRICATING THE SAME

BACKGROUND OF THE INVENTION

The present invention relates to a display panel and a method for fabricating the display panel. The display panel of this invention is applicable to a liquid crystal panel, a plasma display panel, an electrochromic display panel and the like.

In order to reduce the thickness of a liquid crystal panel, that is, one of display devices, reduction in the thickness of a substrate has been conventionally examined. In a current liquid crystal panel, a pair of glass substrates each having a thickness of 3 mm through 0.4 mm are generally used, and a liquid crystal layer with a thickness of several sum is interposed between these substrates. When a glass substrate with a thickness smaller than 0.4 mm is used, the mechanical strength is lowered, and hence, there arises, for example, a problem that the glass substrate is broken during the use.

Japanese Laid-Open Patent Publication No. 6-340029 discloses a layered plate in which a glass film with a thickness of 500 μm or less is provided on one face or both faces of a resin plate composed of at least one resin layer. This layered plate has surface hardness equivalent to that of glass and a thermal characteristic and a cut characteristic of the resin as well as surface characteristics such as solvent resistance and an anti-static property equivalent to those of glass.

Japanese Laid-Open Patent Publication No. 2001-113631 discloses a plastic/glass film layered product in which a plastic film with a thickness not less than 1 μm and not more than 1000 μm is provided and fixed on at least one face of a glass film with a thickness not less than 0.1 μm and not more than 100 μm. This layered product has chemical resistance, abrasive resistance and a gas barrier property equivalent to those of glass and is good at a handling property and a fabrication quality.

Japanese Laid-Open Patent Publication No. 2001-162721 discloses a heat-curing type resin composite in which a covering layer of a glass film or a combination of a glass film and a resin layer is fixed on a face of a heat-curing type resin body. Also, it is described in Paragraph 0041 of this publication that the glass film has a thickness of preferably 0.1 through 100 μm and more preferably 0.1 through 20 μm.

None of the aforementioned publications discloses use of the layered product or the composite described therein as a substrate for a display device. The present inventors have fabricated liquid crystal panels by using these layered product and the composite and using a fabrication line for liquid crystal panels, resulting finding the following:

First, in order that a liquid crystal panel resists impact applied on the fabrication line, both faces of a glass substrate should be coated with a resin. Accordingly, the total thickness of the layered product or the composite is increased, and hence, it is difficult to reduce the thickness and the weight of a display device. In addition, the fabrication cost is increased.

Secondly, since the heat resistance temperature is varied (approximately between 250° C. through 300° C.) depending upon the kind of resin to be employed, the quantity of heat appliable to the layered product or the composite during the fabrication process is restricted. Also, in placing a resin layer on a glass substrate and in heating/cooling process for the layered plate, a warp is caused in the layered product or the composite due to the difference in the coefficient of thermal expansion between the glass and the resin, and hence, the ratio of defectives is high. For example, in the case where a layered substrate in which a resin layer is provided on a glass substrate with a thickness of approximately 0.2 mm is allowed to pass through the fabrication line, when the heating/cooling process is repeated, a warp is caused in the substrate due to the difference in the coefficient of thermal expansion between the glass and the resin even at a temperature lower than the heat resistance temperature of the resin. As a result, a problem may occur that the substrate is broken or the patterning accuracy or the aligning accuracy is lowered. Accordingly, due to these restrictions on the fabrication line, the layered product and the composite disclosed in the aforementioned publications cannot be suitably used for mass production of liquid crystal panels.

On the other hand, Japanese Laid-Open Publication No. 2002-297054 discloses a substrate for a display device using a layered sheet including a glass layer with a thickness of 50 through 700 μm and resin layers, each with a thickness of 1 through 7000 μm and a given average coefficient of linear thermal expansion, on both faces of the glass layer. According to the substrate for a display device disclosed in this publication, since the difference in the average coefficient of linear thermal expansion between the glass layer and the resin layers is small, change such as a crack is not observed in the resin layers in a heat resistance evaluation test. In this substrate for a display device, however, since the resin layers are formed on the faces of the glass layer, when a pair of these substrates for a display device are used for fabricating a liquid crystal panel, the thickness of the liquid crystal panel is large. Thus, it is difficult to reduce the thickness and the weight of the display panel.

SUMMARY OF THE INVENTION

An object of the invention is realizing a small thickness and a small weight of a display panel freely from restrictions on the fabrication line.

The display panel according to a first aspect of the invention includes a pair of glass substrates each having a thickness not less than 0.15 mm and not more than 0.3 mm; and a sealing material for bonding the pair of glass substrates to each other, and a resin layer is formed on an outer face of at least one of the pair of glass substrates.

In this display panel, the mechanical strength of the display panel is improved by covering merely the outer face of the one or two glass substrates with the resin. This is because sufficient strength against external stress can be secured by reinforcing merely the outermost face of the display panel with the resin since the opposing two glass substrates are bonded to each other with the sealing material. Accordingly, as compared with the case where the both faces of the respective two glass substrates are reinforced, the total thickness of the resin layer is smaller in this display panel, and hence, a small thickness and a small weight of the display panel can be realized. Also, since this display panel has mechanical strength sufficient for resisting impact applied on a fabrication line, the display panel is suitable for mass production using the fabrication line.

The resin layer may be mainly made of an organic resin. Thus, as compared with a display panel having an exposed glass substrate, the abrasive resistance can be improved, so that the surface of the display panel can be hardly damaged. Also, since the organic resin layer is formed on the glass substrate, the resin layer can be formed even on a glass substrate with a comparatively small curvature. Thus, a flexible and hard resin-glass layered plate can be obtained.

The resin layer may include a hybrid material composed of inorganic colloid particles and an organic binder resin. Since an inorganic-organic composite thin film including the hybrid material has not only organic properties but also inorganic properties, the dynamic characteristics such as an elastic modulus and hardness are improved, and the heat resistance and the chemical resistance are remarkably improved.

The resin layer preferably has a thickness not less than 2 μm and not more than 50 μm. Thus, sufficient mechanical strength can be provided to a thinned glass substrate with a thickness not less than 0.15 mm and not more than 0.3 mm, and the fabrication quality can be also improved, resulting in realizing a small thickness and a small weight.

One of the pair of glass substrates may have a terminal portion on its inner face and outside the sealing material, and a resin layer may be formed on the terminal portion. In a display panel, a terminal portion corresponds to one glass substrate disposed outside a sealing material and hence is the weakest against stress due to its structure. When the resin layer is formed on the terminal portion, in other words, when the both faces of the terminal portion alone are coated with the resin, the terminal portion that is the weakest against stress due to its structure can be effectively reinforced.

An integrated circuit chip is preferably mounted on the terminal portion, and at least a connection part between the terminal and the integrated circuit chip is preferably covered with a resin. Thus, the connection part between the terminal and the integrated circuit chip is reinforced by the resin coat, so as to improve the connection reliability.

A polarizing layer may be formed on an inner face of at least one of the pair of glass substrates. Thus, when a light modulation layer such as a liquid crystal layer is interposed between the pair of substrates, retardation change derived from a tolerance in the glass thickness caused by etching or a tolerance in the thickness of the resin layer can be suppressed. Also, the strength of the glass substrate can be improved.

The display panel according to a second aspect of the invention includes a pair of glass substrates each with a thickness not less than 0.15 mm and not more than 0.3 mm; and a sealing material for bonding the pair of glass substrates to each other, and at least part of end faces of the pair of glass substrates has a resin layer.

In the display panel according to the second aspect, at least part of the end faces is covered with the resin, so as to improve the mechanical strength of the display panel. This is because the strength can be improved by coating, with the resin, the edge of the display panel, which is the weakest against stress due to its structure. Accordingly, as compared with the case where the both faces of the respective two glass substrates are reinforced, the total thickness of the resin layer is smaller in this display panel, and hence, a small thickness and a small weight of the display panel can be realized. Also, since this display panel has mechanical strength sufficient for resisting impact applied on a fabrication line, the display panel is suitable for mass production using the fabrication line.

In the display panel of the second aspect, the sealing material may have an injection port sealed with the resin layer. Thus, not only the strength of the edge of the display panel can be improved but also the injection port of the sealing material can be sealed so as to prevent a display medium such as a liquid crystal material from leaking through the injection port. Also, when the injection port is sealed with an end-sealing material, the end-sealing material may be shifted or peeled off due to impact applied on the fabrication line so that the display medium can leak through the injection port. In contrast, when the injection port of the sealing material is covered with the resin, the display medium can be prevented from leaking through the injection port even when the end-sealing material is shifted or the like.

In the display panel of the second aspect, each of the pair of glass substrates preferably has an outer face on which a resin layer is formed. Alternatively, a whole face of the display panel is preferably covered with a resin layer. Thus, high mechanical strength and high reliability can be attained. Also, as compared with the case where the both faces of the respective two glass substrates are reinforced, the total thickness of the display panel can be small, so as to realize a small thickness and a small weight of the display panel.

The method according to the first aspect of the invention for fabricating the display panel according to the first aspect, includes the steps of aligning a pair of glass substrates each with a thickness of 0.3 mm or more with the sealing material sandwiched therebetween; reducing thicknesses of the pair of aligned glass substrates until each thickness becomes not less than 0.15 mm and not more than 0.3 mm; and forming the resin layer on the outer face of at least one of the pair of glass substrates whose thicknesses have been reduced.

In this fabrication method, the step of aligning substrates is carried out before the step of forming a resin layer, and therefore, restriction in the quantity of heat appliable in the fabrication process can be relaxed. Furthermore, in obtaining a layered plate by providing the resin layer on the glass substrate or in process for applying heat to the layered plate such as pressing process, the layered plate can be prevented from having a warp due to a difference in the coefficient of thermal expansion between the glass and the resin (for example, a plastic). Moreover, the problem such as lowering of alignment accuracy can be avoided in the step of aligning the substrates. Accordingly, a thin resin (for example, a plastic film) tempered glass substrate can be easily obtained.

The step of reducing thicknesses preferably includes a sub-step of performing chemical etching or physical polishing.

The method according to the second aspect of the invention for fabricating a display panel that includes a pair of glass substrates each with a thickness not less than 0.15 mm and not more than 0.3 mm and a sealing material for bonding the pair of glass substrates to each other and in which a resin layer is formed on both faces of the display panel, includes the steps of forming a pair of layered plates (glass-resin-glass) each by placing a supporting substrate on each of the pair of glass substrates with the resin layer sandwiched therebetween; aligning the pair of layered plates with the sealing material sandwiched therebetween and with the supporting substrates facing outside; and removing the supporting substrates from the pair of aligned layered plates by chemical etching.

The supporting substrate has a thickness of preferably 0.5 mm or more, and more preferably 0.7 mm or more. The resin layer preferably has a thickness not less than 2 μm and not more than 50 μm. The resin layer is preferably a layer mainly made of an organic resin, or a layer including a hybrid material composed of inorganic colloid particles and an organic binder resin.

In this fabrication method, since the layered plate has a sufficiently large thickness, the mechanical strength on the fabrication line can be secured. Also, since the supporting substrate can be sufficiently thick, a warp of the substrate caused by a difference in the coefficient of thermal expansion can be suppressed. In other words, this substrate is free from the temperature restriction. Accordingly, the substrates can be stably aligned with the sealing material sandwiched therebetween. Furthermore, in removing the supporting substrates by the chemical etching after the alignment, the resin layer can work as an etching stopper, and therefore, the total thickness of the resin layer and the glass substrate can be made uniform.

The method according to the third aspect of the invention for fabricating a display panel that includes a pair of glass substrates each with a thickness not less than 0.15 mm and not more than 0.3 mm, a sealing material for bonding the pair of glass substrates to each other and a liquid crystal material filled in a space formed by the pair of glass substrates and the sealing material, includes the steps of aligning a pair of glass substrates each with a thickness of 0.3 mm or more with the sealing material having an injection port sandwiched therebetween; exposing the injection port of the sealing material on end faces of the pair of glass substrates by breaking the pair of aligned glass substrates; reducing thicknesses of the pair of glass substrates until each thickness becomes not less than 0.15 mm and not more than 0.3 mm; filling the liquid crystal material in the space through the injection port; and forming a resin layer on at least end faces corresponding to the injection port among all end faces of the pair of glass substrates.

In this fabrication method, a display panel having mechanical strength improved at its edge can be easily fabricated. Also, since the mechanical strength of the edge is improved as well as the injection port of the sealing material can be sealed by covering the end faces corresponding to the injection port with the resin, increase of the number of procedures can be suppressed, so as to realize high efficiency and low cost. In the case where a plurality of liquid crystal panels are obtained from mother glass substrates, the breaking processing for exposing the injection ports and obtaining each cell (terminal exposure) can be carried out in one procedure, and hence, stress applied in the breaking process can be largely reduced. In this fabrication method, since the thicknesses of the substrates are reduced after the breaking processing, the occurrence of defectives can be suppressed as compared with the case where thinned glass substrates are subjected to the breaking processing.

The method according to the fourth aspect of the invention for fabricating a display panel that includes a pair of glass substrates each with a thickness not less than 0.15 mm and not more than 0.3 mm, a sealing material for bonding the pair of glass substrates each other and a liquid crystal material filled in a space formed by the pair of glass substrates and the sealing material, includes the steps of forming the sealing material on one of a pair of glass substrates each with a thickness of 0.3 mm or more; dropping the liquid crystal material in a portion surrounded with the sealing material; aligning the pair of glass substrates with the sealing material sandwiched therebetween; reducing thicknesses of the pair of aligned glass substrates until each thickness becomes not less than 0.15 mm and not more than 0.3 mm; and forming a resin layer on at least part of end faces of the pair of glass substrates.

In this fabrication method, a display panel having mechanical strength improved at its edge can be easily fabricated. Also, the liquid crystal material is filled before reducing the thicknesses of the glass substrates. Therefore, the substrates can be prevented from being cracked by external stress. Accordingly, a thin display panel can be easily fabricated without lowering the yield.

The step of reducing thicknesses preferably includes a sub-step of performing chemical etching or physical polishing.

The step of forming a resin layer preferably includes a sub-step of covering end faces and outer faces of the pair of glass substrates with the resin layer. In this fabrication method, the step of aligning substrates is performed before forming the resin layer on the end faces and the outer faces of the pair of glass substrates, in other words, the whole outer face of the display panel. Therefore, the restriction in the quantity of heat appliable in the fabrication process can be relaxed. Furthermore, in obtaining a layered plate by providing the resin layer on the glass substrate or in process for applying heat to the layered plate such as pressing process, the layered plate can be prevented from having a warp due to a difference in the coefficient of thermal expansion between the glass and the resin (for example, a plastic). Moreover, the problem such as lowering of alignment accuracy can be avoided in the step of aligning the substrates. Accordingly, a thin resin (for example, a plastic film) tempered glass substrate can be easily obtained.

BRIEF DESCRIPTION OF THE DRAWINGS

FIGS. 4A and 4B are cross-sectional views taken along line IVA-IVA of FIG. 3A and line IVB-IVB of FIG. 3B, respectively;

FIGS. 9A and 9B are cross-sectional views taken along line IXA-IXA of FIG. 8A and line IXB-IXB of FIG. 8B, respectively;

FIGS. 21A and 21B are cross-sectional views taken along line XXIA-XXIA of FIG. 20A and line XXIB-XXIB of FIG. 20B, respectively.

DETAILED DESCRIPTION OF THE INVENTION

Preferred embodiments of the invention will now be described with reference to the accompanying drawings. In each of the following embodiments, a liquid crystal panel is described as an example of a display panel, and the display panel according to this invention is applicable to any of display panels other than the liquid crystal panel. Specifically, the display panel of this invention is applicable to any display device employing, as a display medium, an optical medium other than a liquid crystal material, such as a plasma display panel (PDP), an inorganic or organic EL (electroluminescence) display panel, an electrochromic display (ECD) panel or an electrophoretic display panel. Also, the display panel of this invention can be used as a parallax barrier device used in a stereo image display device or as a liquid crystal device used in an image shift device. It is noted that the stereo image display device includes a parallax barrier device and a picture display device having, for example, a pixel portion for a right eye and a pixel portion for a left eye, and the image shift device includes a liquid crystal device and a birefringence device.

Embodiment 1

Figure 1:
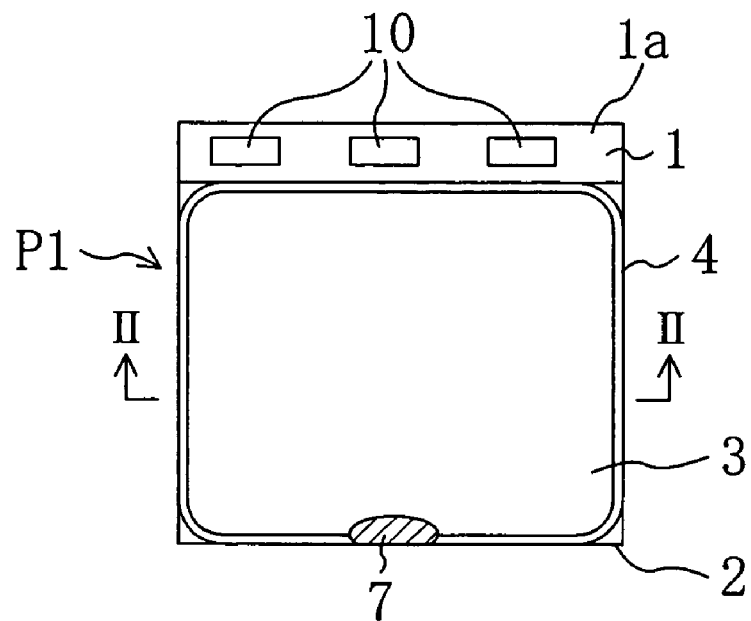
FIG. 1 is a plan view for schematically showing a liquid crystal panel P1 according to Embodiment 1 of the invention.
Figure 2:
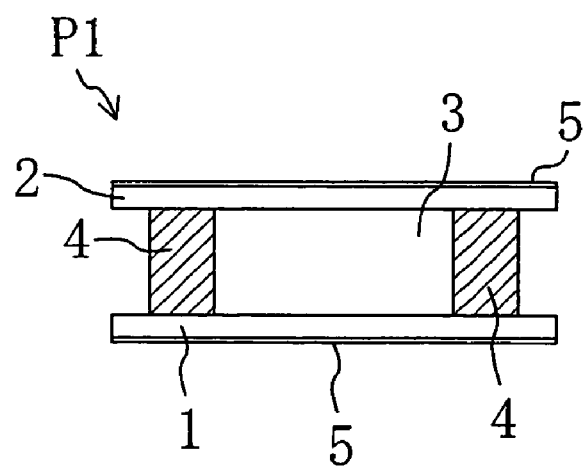
FIG. 2 is a cross-sectional view taken along line II-II of FIG. 1.

FIG. 1 is a plan view for schematically showing a liquid crystal panel P1 according to Embodiment 1, and FIG. 2 is a cross-sectional view thereof taken along line II-II of FIG. 1. This liquid crystal panel P1 includes an IC chip for driving a liquid crystal (hereinafter referred to as the "driving IC") 10 mounted in the form of a bare chip on the liquid crystal panel P1 by the COG (Chip On Glass) method.

The liquid crystal panel P1 has an element substrate 1 on which a switching element is formed, a counter substrate 2 disposed to oppose the element substrate 1, and a liquid crystal layer 3 interposed between these substrates 1 and 2. The substrates 1 and 2 are aligned with a sealing material 4 sandwiched therebetween. On one face of the element substrate 1 on the side of the liquid crystal layer 3 (namely, the inner face), a plurality of pixel electrodes (not shown) arranged in the form of a matrix are formed, and on one face of the counter substrate 2 on the side of the liquid crystal layer 3 (namely, the inner face), a common electrode (not shown) is formed. The plural pixel electrodes arranged in the form of a matrix are respectively connected to TFTs (Thin Film Transistors) for controlling respective voltage application. The TFTs are connected to source lines and gate lines connected to the driving IC 10. The switching of each TFT is controlled in accordance with a gate signal supplied from the driving IC 10, so as to control the voltage application to the plural pixel electrodes arranged in the form of a matrix. Thus, the transmissivity of the liquid crystal layer 3 in each pixel is controlled for producing gray scale display.

Each of the element substrate 1 and the counter substrate 2 is a glass substrate with a thickness not less than 0.15 mm and not more than 0.3 mm. One face on the opposite side of the liquid crystal layer 3 (namely, the outer face) of at least one of the substrates 1 and 2 is covered with a resin layer 5. In this embodiment, the resin layer 5 is formed on the outer faces of both the substrates 1 and 2.

On the inner face of the element substrate 1, a terminal (not shown) is formed outside the sealing material 4. The terminal is connected to the source line or the gate line formed on the element substrate 1. A bump of the driving IC 10 is bonded to this terminal so that the driving IC 10 can be mounted in the form of a bare chip on the liquid crystal panel P1. Herein, a portion of the element substrate 1 that is outside the sealing material 4 and in which or in the vicinity of which the terminal is formed is designated as a terminal portion 1a.

Figure 3A:
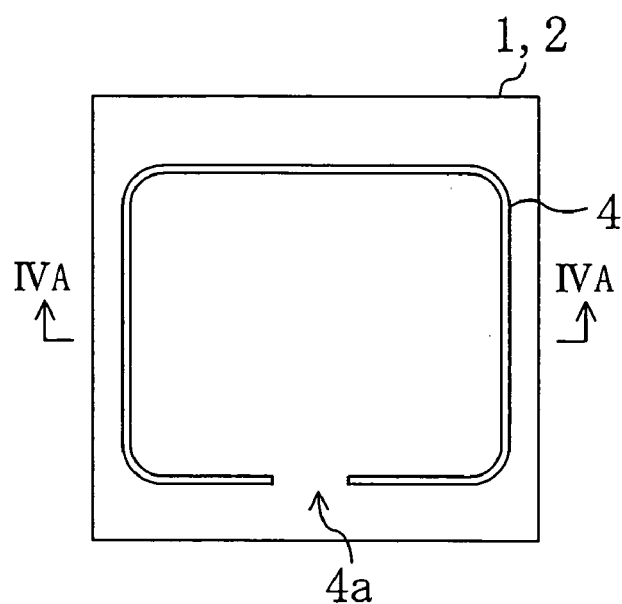
FIGS. 3A, 3B and 3C are plan views for schematically showing fabrication procedures for the liquid crystal panel P1.
Figure 3B:
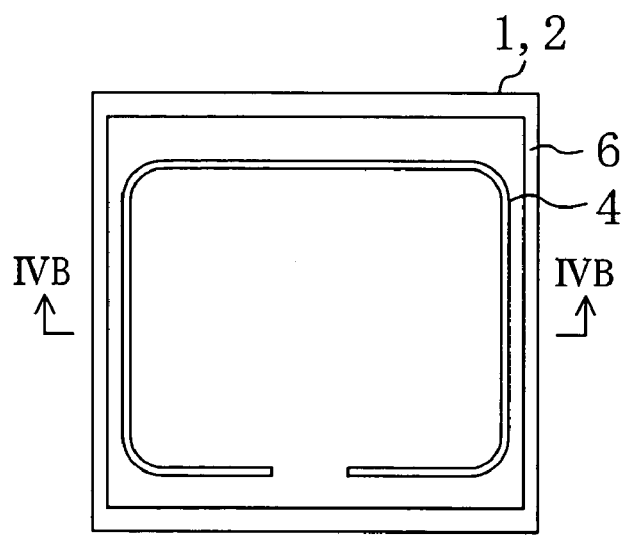
Figure 3C:
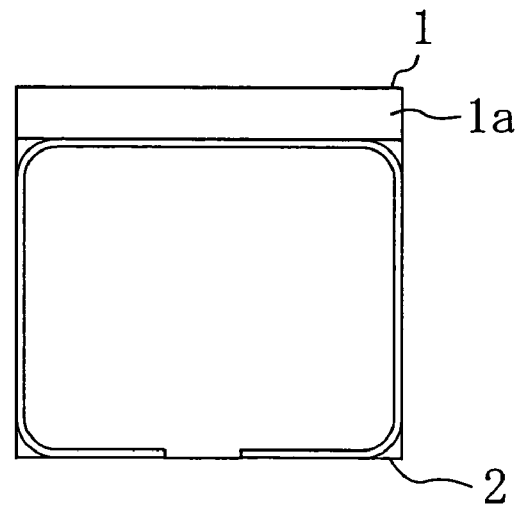
Figure 4A:
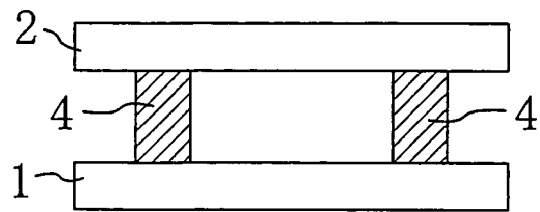
FIGS. 4A, 4B and 4C are cross-sectional views for schematically showing fabrication procedures for the liquid crystal panel P1, and specifically.
Figure 4B:
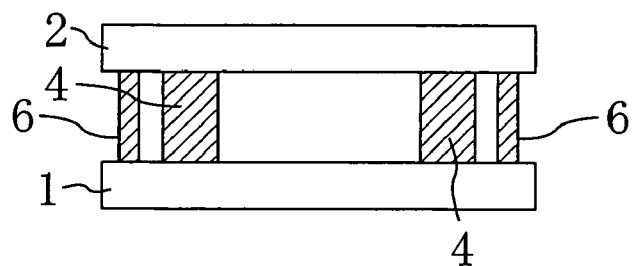
Figure 4C:
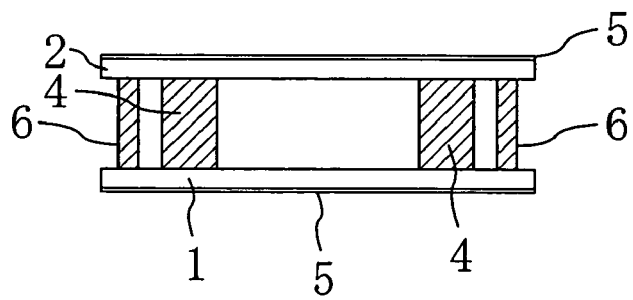

Next, fabrication process for the liquid crystal panel P1 of this embodiment will be described with reference to the accompanying drawings. FIGS. 3A, 3B and 3C are plan views for schematically showing fabrication procedures for the liquid crystal panel P1. FIGS. 4A, 4B and 4C are cross-sectional views for schematically showing fabrication procedures for the liquid crystal panel P1, and more specifically, FIGS. 4A and 4B are cross-sectional views taken along line IVA-IVA of FIG. 3A and line IVB-IVB of FIG. 3B, respectively.

First, TFT devices, source lines, gate lines, pixel electrodes including ITO (Indium Tin Oxide) and the like, and an alignment layer for covering the pixel electrodes (these elements are not shown) are formed on a soda glass substrate with a thickness of 0.4 mm, and the alignment layer is then subjected to the rubbing processing. Thus, an element substrate 1 is obtained. Also, a color filter layer and an alignment layer (both not shown) are formed on another soda glass substrate with a thickness of 0.4 mm, and the alignment layer is then subjected to the rubbing processing. Thus, a counter substrate 2 is obtained.

In a peripheral region on the element substrate 1, a sealing material 4 for surrounding a display area is formed. The sealing material 4 can be formed by the dispenser method in which a sealing pattern is drawn on the substrate 1 by using a dispenser or by the screen printing method in which a sealing pattern already patterned is printed on the substrate 1. As the sealing material 4, a heat-curing type resin or a ultraviolet curing type resin is used. After positioning the substrates 1 and 2, the substrates 1 and 2 are aligned with the sealing material 4 sandwiched therebetween. While pressing the substrates 1 and 2 to each other, the substrates 1 and 2 are heated or irradiated with ultraviolet so as to be aligned (as shown in FIGS. 3A and 4A). It is noted that the sealing material 4 has an injection port 4a through which a liquid crystal material is filled.

A UV (ultraviolet) curing type adhesive 6 is permeated by using a dispenser into a peripheral portion between the substrates 1 and 2. The adhesive 6 is cured by using a UV irradiation device, so that the inside between the substrates can be sealed and isolated from the outside (as shown in FIGS. 3B and 4B).

The substrates 1 and 2 are reduced in their thicknesses by chemical etching in which the outer faces of the substrates 1 and 2 are exposed to hydrofluoric acid. This thickness reduction is performed until the thickness of each of the substrates 1 and 2 becomes not less than 0.1 mm and not more than 0.3 mm, namely, until the total thickness of the aligned substrates becomes approximately not less than 0.2 mm and not more than 0.6 mm. Although the thicknesses are reduced by the chemical etching in this embodiment, the thicknesses may be reduced by physical polishing instead. In the case where the physical polishing is employed, there is no need to seal the edges of the substrates with the UV curing type adhesive 6.

An acrylic resin is used as a heat-curing type resin material, which is applied on the outer faces of the substrates 1 and 2 by using a spin coater. The resultant is heated at approximately 200° C., so as to form a resin layer 5 with a thickness not less than 1 μM and not more than 10 μm, and preferably not less than 2 μm and not more than 50 μm. Thus, the liquid crystal panel P1 is obtained (as shown in FIG. 4C).

Although the heat-curing type resin is used in this embodiment, a UV (ultraviolet) curing type resin may be used for forming the resin layer 5. Examples of the resin are organic resins such as an epoxy resin, a PES (polyether sulfone) resin, a urethane resin, and a vinyl acetate resin. The resin layer 5 is mainly made of an organic resin. Alternatively, a hybrid material highly adhesive to the glass substrate is preferably used instead of the organic resin. When the hybrid material is used, the dynamic characteristics such as an elastic modulus and hardness are improved, and the heat resistance and the chemical resistance are remarkably improved. The hybrid material is composed of inorganic colloid particles and an organic binder resin. For example, the hybrid material is composed of inorganic colloid particles of silica or the like and an organic binder resin such as an epoxy resin, a polyurethane acrylate resin or a polyester acrylate resin.

After forming the resin layer 5, the liquid crystal panel P1 is subjected to the breaking processing for obtaining a predetermined size and the adhered portion with the adhesive 6 is removed. Also, the injection port 4a of the sealing material 4 is exposed on the end faces of the substrates 1 and 2. In the breaking processing, a scribe line is drawn on the face of the glass substrate so that the glass substrate can be broken along the scribe line. After the breaking processing, a portion of the counter substrate opposing the terminal portion 1a of the element substrate 1 is broken to be removed, so as to expose the inner face of the terminal portion 1a (as shown in FIG. 3C). Hereinafter, this exposure of the inner face of the terminal portion 1a is sometimes designated as "terminal exposure".

The liquid crystal material is filled through the injection port 4a of the sealing material 4 so as to form a liquid crystal layer 3 between the substrates 1 and 2. The liquid crystal material can be filled by the dispenser method or the dipping method. After filling the liquid crystal material, the injection port 4a is sealed with an end-sealing material 7. Specifically, a dispenser is used for applying a heat-curing or UV curing type resin on the injection port 4a, and the applied resin is cured by heating or irradiating with UV. Thereafter, a driving IC 10 is mounted in the form of a bare chip on the inner face of the terminal portion 1a of the element substrate 1. Thus, the liquid crystal panel P1 of this embodiment is completed (see FIG. 1).

TEST EXAMPLE

A variety of liquid crystal panels each having different thicknesses of glass substrates and resin layers are fabricated. These liquid crystal panels are used for examining occurrence of cracks during the breaking processing and the terminal exposure. The results are listed in Table 1 below.

TABLE 1

| Glass thickness (mm) | No resin layer | | | Resin layer of 1 μm | | | Resin layer of 2 μm | | |
|---|---|---|---|---|---|---|---|---|---|
| | No. | Crack in breaking | Spoiled in terminal exposure | No. | Crack in breaking | Spoiled in terminal exposure | No. | Crack in breaking | Spoiled in terminal exposure |
| 0.10 | | x | x | | x | x | 7 | x | x |
| 0.15 | | x | x | 4 | x | x | 8 | o | o |
| 0.20 | | x | x | 5 | o | x | | o | o |
| 0.25 | 1 | x | x | 6 | o | o | | o | o |
| 0.30 | 2 | o | x | | o | o | | o | o |
| 0.35 | 3 | o | o | | o | o | | o | o |
| 0.40 | | o | o | | o | o | | o | o |

In Table 1, a symbol "x" denotes occurrence and a symbol "o" denotes non-occurrence of cracks.

In the liquid crystal panels having no resin layer, in the case where the glass substrate has a thickness of 0.25 mm or less, the substrate is too thin to attain breaking accuracy in the breaking processing, and hence, cracks are caused in the substrate. Also, since the mechanical strength of the terminal portion is so low that the terminal portion is spoiled in the terminal exposure (see the panel No. 1 of Table 1). In the case where the glass substrate has a thickness of 0.30 mm, the glass substrate is sufficiently thick for avoiding cracks in the breaking processing. However, the terminal portion is spoiled in the terminal exposure (see the panel No. 2 of Table 1). In the case where the glass substrate has a thickness of 0.35 mm or more, no cracks are caused in the substrate in the breaking processing. Also, the terminal portion is not spoiled in the terminal exposure (see the panel No. 3 of Table 1). However, in the case where the glass substrate has a thickness of 0.35 mm or more, the total thickness of the liquid crystal panel is approximately 0.7 mm, and hence, the object to attain a small thickness of the liquid crystal panel cannot be achieved.

In the liquid crystal panels each having a resin layer with a thickness of 1 μm, in the case where the glass substrate has a thickness of 0.15 mm or less, the substrate is too thin to attain breaking accuracy in the breaking processing, and hence, cracks are caused in the substrate. Also, the mechanical strength of the terminal portion is so low that the terminal portion is spoiled in the terminal exposure (see the panel No. 4 of Table 1). In the case where the glass substrate has a thickness of 0.20 mm, the glass substrate is sufficiently thick for avoiding cracks in the breaking processing. However, the terminal portion is spoiled in the terminal exposure (see the panel No. 5 of Table 1). In the case where the glass substrate has a thickness of 0.25 mm or more, no cracks are caused in the substrate in the breaking processing. Also, the terminal portion is not spoiled in the terminal exposure (see the panel No. 6 of Table 1). Furthermore, the liquid crystal panels having the resin layer with a thickness of 1 μm exhibit better properties in strength tests such as a drop test than the liquid crystal panels having no resin layer. Accordingly, it is found that the liquid crystal panels having the resin layer with a thickness of 1 μm are more suitable for the mass production using a fabrication line than the liquid crystal panels having no resin layer.

In the liquid crystal panels having a resin layer with a thickness of 2 μm, in the case where the glass substrate has a thickness of 0.10 mm, the substrate is too thin to attain breaking accuracy in the breaking processing, and hence, cracks are caused in the substrate. Also, the mechanical strength of the terminal portion is so low that the terminal portion is spoiled in the terminal exposure (see the panel No. 7 of Table 1). In the case where the glass substrate has a thickness of 0.15 mm, no cracks are caused in the substrate in the breaking processing. Also, the terminal portion is not spoiled in the terminal exposure (see the panel No. 8 of Table 1). Although not listed in Table 1, a liquid crystal panel having a resin layer with a thickness larger than 50 μm and a glass substrate with a thickness of 0.15 mm, no cracks are caused and the terminal portion is not spoiled. However, when the resin layer is thicker than 50 μm, the total thickness of the liquid crystal panel is larger by approximately 0.1 mm than a liquid crystal panel with no resin layer, and hence, the merit of reducing the thickness cannot be attained. Furthermore, since the specific gravity of the resin is larger than that of the glass, the merit of reducing the weight cannot be attained. Therefore, in consideration of the total thickness and the weight of the liquid crystal panel, the thickness of the resin layer is preferably 20 μm or less.

Embodiment 2

Figure 5:
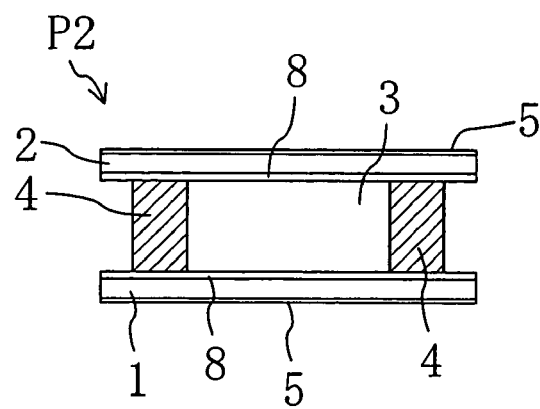
FIG. 5 is a cross-sectional view for schematically showing a liquid crystal panel P2 according to Embodiment 2 of the invention.

FIG. 5 is a cross-sectional view for schematically showing a liquid crystal panel P2 according to Embodiment 2. In the drawings referred to below, the same reference numerals are used to refer to elements with substantially like functions as those of the liquid crystal panel P1, so as to omit the description.

The liquid crystal panel P2 of this embodiment is different from the liquid crystal panel P1 of Embodiment 1 in a polarizing layer 8 formed on the inner faces of the element substrate 1 and the counter substrate 2. When the polarizing layer 8 is thus formed in the liquid crystal panel P2, polarized light can be prevented from being disturbed by in-plane variation in the substrate thickness caused by etching or variation in the thickness of the resin layer, and hence, the display quality can be prevented from being harmfully affected by disturbed polarized light. Furthermore, since the polarizing layer 8 is formed on the element substrate 1 and the counter substrate 2, the strength of the glass substrates can be improved.

The fabrication process for the liquid crystal panel P2 of this embodiment is different from that for the liquid crystal panel P1 of Embodiment 1 merely in forming the alignment layer after forming the polarizing layer 8 on the inner faces of the element substrate 1 and the counter substrate 2. The polarizing layer 8 can be formed by applying a resin including a dichromatic pigment or dye on the substrate and curing the resin. Examples of the dichromatic pigment or dye are diazo-based, trisazo-based and anthraquinone-based pigments or dyes.

Embodiment 3

Figure 6:
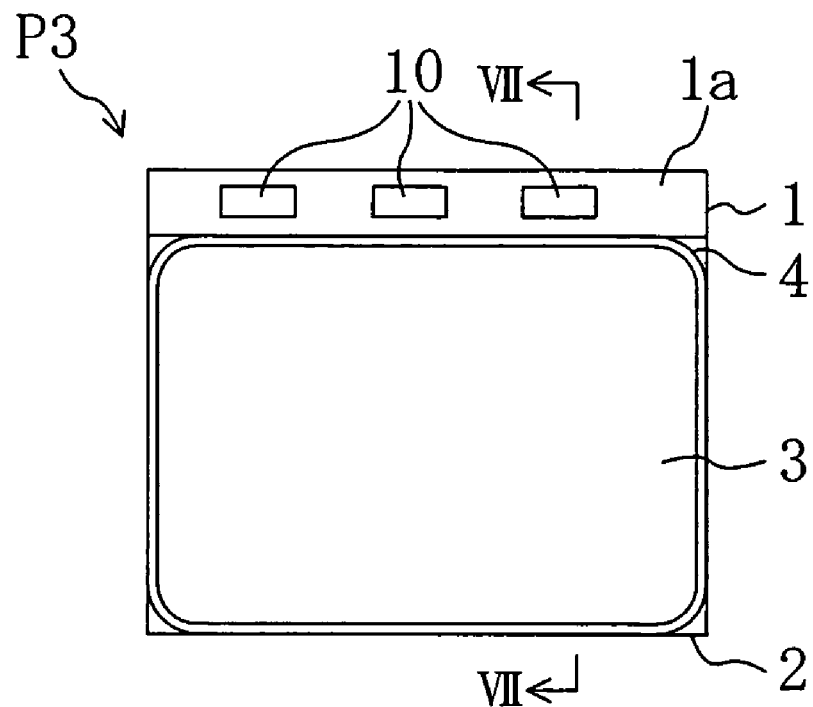
FIG. 6 is a plan view for schematically showing a liquid crystal panel P3 according to Embodiment 3 of the invention.
Figure 7:
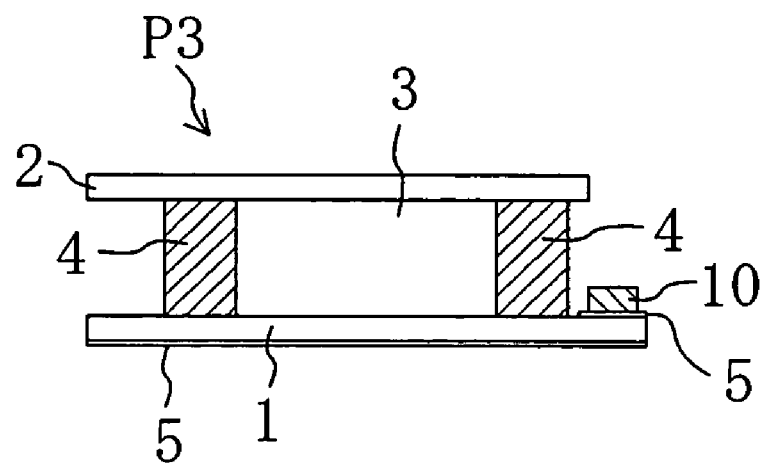
FIG. 7 is a cross-sectional view taken along line VII-VII of FIG. 6.

FIG. 6 is a plan view for schematically showing a liquid crystal panel P3 according to Embodiment 3, and FIG. 7 is a cross-sectional view thereof taken along line VII-VII of FIG. 6. In the liquid crystal panel P3 of this embodiment, a resin layer 5 is formed on the outer face of an element substrate 1 and the inner face of a terminal portion 1a of the element substrate 1. In other words, the resin layer 5 is formed on the both faces of the terminal portion 1a. Also, a connection part between a terminal and a driving IC 10 is covered with a resin. Since the connection part between the terminal and the driving IC 10 is reinforced by the resin coat in this manner, the connection reliability can be improved.

Figure 8A:
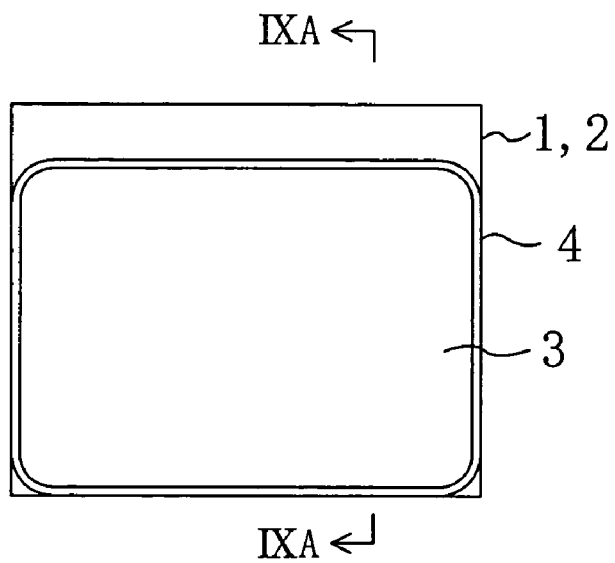
FIGS. 8A and 8B are plan views for schematically showing fabrication procedures for the liquid crystal panel P3.
Figure 8B:
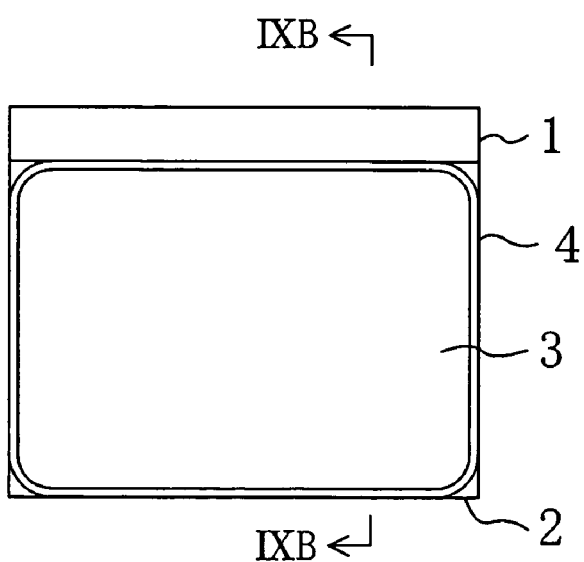
Figure 9A:
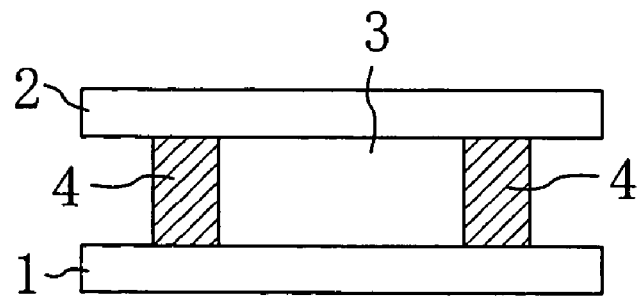
FIGS. 9A, 9B and 9C are cross-sectional views for schematically showing fabrication procedures for the liquid crystal panel P3, and specifically.
Figure 9B:
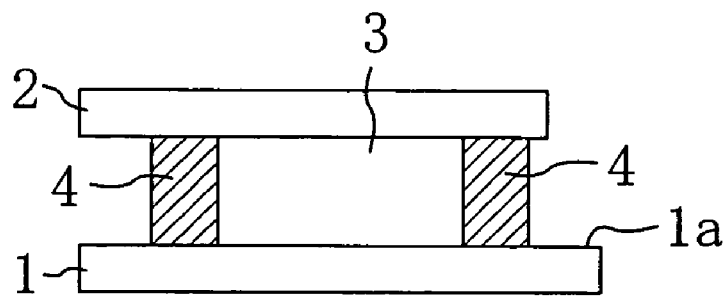
Figure 9C:
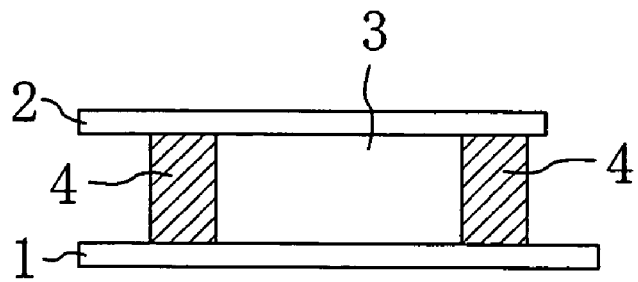

The fabrication process for the liquid crystal panel P3 of this embodiment will now be described with reference to the accompanying drawings. FIGS. 8A and 8B are plan views for schematically showing fabrication procedures for the liquid crystal panel P3, and FIGS. 9A, 9B and 9C are cross-sectional views for schematically showing fabrication procedures for the liquid crystal panel P3. More specifically, FIGS. 9A and 9B are cross-sectional views taken along line IXA-IXA of FIG. 8A and line IXB-IXB of FIG. 8B, respectively.

First, in the same manner as in Embodiment 1, a TFT device and the like are formed on a soda glass substrate with a thickness of 0.4 mm, so as to obtain an element substrate 1. Also, a color filter layer and the like are formed on another soda glass substrate with a thickness of 0.4 mm, so as to obtain a counter substrate 2.

A sealing material 4 for surrounding a display area is formed in a peripheral portion on the element substrate 1 by the screen printing or the like. As the sealing material 4, for example, a ultraviolet curing type resin is used. After dropping a liquid crystal material on the counter substrate 2, the substrates 1 and 2 are aligned with the sealing material 4 sandwiched therebetween. While pressing the substrates 1 and 2 to each other, the substrates 1 and 2 are irradiated with ultraviolet for curing the sealing material 4, so as to bond the substrates 1 and 2 to each other (as shown in FIGS. 8A and 9A). In this embodiment, a liquid crystal layer 3 is formed at the same time as the alignment of the substrates 1 and 2.

After subjecting the liquid crystal panel P3 to the breaking processing to obtain a predetermined size, the terminal exposure is carried out. Thus, the inner face of a terminal portion 1a of the element substrate 1 is exposed (as shown in FIGS. 8B and 9B).

The substrates 1 and 2 are reduced in their thicknesses by the physical polishing. Specifically, the outer faces of the substrates 1 and 2 are polished by using, for example, a polishing machine. This thickness reduction is performed until the thickness of each of the substrates 1 and 2 becomes not less than 0.1 mm and not more than 0.3 mm, in other words, until the total thickness of the aligned substrates becomes approximately not less than 0.2 mm and not more than 0.6 mm (as shown in FIG. 9C). A bump of a driving IC 10 is bonded to the terminal of the element substrate 1 for mounting the driving IC 10 in the form of a bare chip on the liquid crystal panel P3.

An acrylic resin is used as a heat-curing type resin material, which is applied on the outer face of the element substrate 1 and the inner face of the terminal portion 1a of the element substrate 1 by the dipping method. At this point, since the driving IC 10 is mounted in the form of a bare chip on the inner face of the terminal portion 1a, a connection part between the terminal and the driving IC 10 is coated with the resin. The resultant is heated at approximately 200° C., so as to form a resin layer 5 with a thickness not less than 1 μm and not more than 100 μm, and preferably not less than 2 μm and not more than 50 μm. Thus, the liquid crystal panel P3 is completed.

Although the heat-curing type resin is used in this embodiment, a UV (ultraviolet) curing type resin may be used for forming the resin layer 5. Examples of the resin are organic resins such as an epoxy resin, a PES (polyether sulfone) resin, a urethane resin, and a vinyl acetate resin. The resin layer 5 is mainly made of an organic resin. Alternatively, a hybrid material highly adhesive to the glass substrate is preferably used instead of the organic resin. The hybrid material is composed of inorganic colloid particles and an organic binder resin. For example, the hybrid material is composed of inorganic colloid particles of silica or the like and an organic binder resin such as an epoxy resin, a polyurethane acrylate resin or a polyester acrylate resin.

In this embodiment, the breaking processing and the terminal exposure are carried out before polishing the glass substrates. In other words, the polishing is performed while the total thickness of the substrates is still large. Accordingly, the thickness can be further reduced than in Embodiment 1, and the glass substrate can be polished to a thickness of, for example, 0.1 mm. In the case where the glass substrate has a thickness of 0.1 mm, however, the terminal portion is spoiled in forming the resin layer afterward. On the other hand, in the case where the glass substrate has a thickness of 0.15 mm, the terminal portion 1a is not spoiled in forming the resin layer. Since the resin layer 5 is formed not only on the outer face of the element substrate 1 but also on the inner face of the terminal portion 1a, the breaking strength of the terminal portion 1a is substantially doubled as compared with the case where the resin layer 5 is formed on the outer face of the element substrate 1 alone (according to a three-point bending test performed on the terminal portion by using EZ tester manufactured by Shimadzu Corporation). Accordingly, it is found that the liquid crystal panel P3 of this embodiment is suitable for the mass production using a fabrication line.

The resin layer 5 is formed on the whole inner face of the terminal portion 1a in this embodiment. However, the resin layer 5 may be formed on part of the inner face of the terminal portion 1a instead of the whole inner face. For example, the resin layer 5 may be formed in a portion in the vicinity of the terminal in the terminal portion 1a, namely, in a portion on the inner face other than the area where the terminal is formed.

Furthermore, although the connection part between the terminal and the driving IC 10 is coated with the resin in this embodiment, not only the connection part but also the driving IC 10 itself may be coated with the resin. Thus, the connection reliability can be further improved.

Although the driving IC 10 is mounted by the COG method before applying the resin material on the inner face of the terminal portion 1a in this embodiment, the driving IC 10 may be mounted after applying the resin material on the inner face of the terminal portion 1a and before curing the resin material. Alternatively, the driving IC 10 may be mounted by the COG method before aligning the element substrate 1 and the counter substrate 2.

Embodiment 4

Figure 10A:
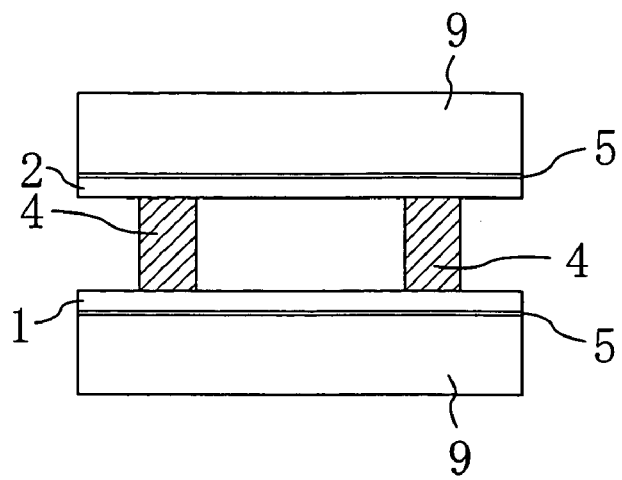
FIGS. 10A, 10B and 10C are cross-sectional views for schematically showing fabrication procedures for a liquid crystal panel according to Embodiment 4.
Figure 10B:
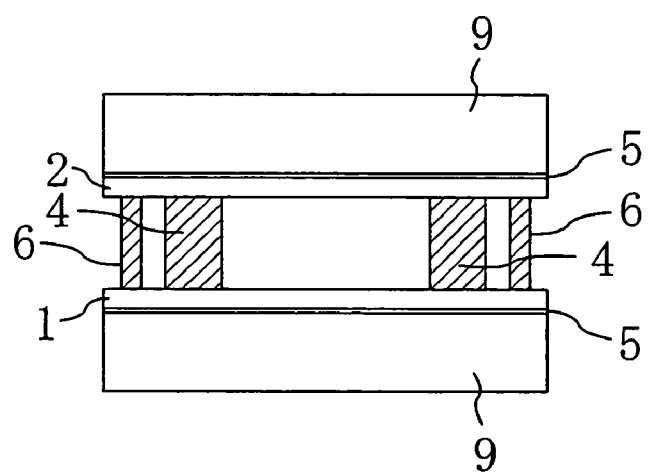
Figure 10C:
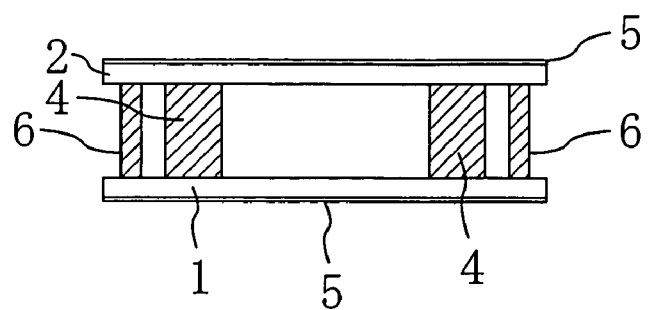

A liquid crystal panel according to Embodiment 4 is identical to the liquid crystal panel P1 shown in FIGS. 1 and 2, and hence, the description of the architecture of the liquid crystal panel of this embodiment is herein omitted. The fabrication process for the liquid crystal panel of this embodiment will be described with reference to the accompanying drawings. FIGS. 10A, 10B and 10C are cross-sectional views for schematically showing fabrication procedures for the liquid crystal panel of this embodiment.

First, a glass substrate with a thickness of 0.5 mm or more and preferably 0.7 mm or more is used as a supporting substrate 9, on which, for example, an acrylic resin is applied as a heat-curing type resin material by using a spin coater or the like. Although the heat-curing type resin is used in this embodiment, a UV (ultraviolet) curing type resin may be used instead. Examples of the resin are organic resins such as an epoxy resin, a PES (polyether sulfone) resin, a urethane resin, and a vinyl acetate resin. Alternatively, a hybrid material highly adhesive to the glass substrate is preferably used instead of the organic resin. The hybrid material is composed of inorganic colloid particles and an organic binder resin. For example, the hybrid material is composed of inorganic colloid particles of silica or the like and an organic binder resin such as an epoxy resin, a polyurethane acrylate resin or a polyester acrylate resin.

A thin glass substrate with a thickness not less than 0.15 mm and not more than 0.3 mm is placed on the supporting substrate 9 with the applied resin layer 5 sandwiched therebetween, and thermo-compression bonding is carried out at approximately 200° C. so as to make the thickness of the resin not less than 1 μm and not more than 100 μm and preferably not less than 2 μm and not more than 50 μm. Two such glass-resin-glass layered plates are prepared. A TFT device and the like are formed on the thin glass substrate of one of the layered plates, so as to obtain an element substrate 1. Similarly, a color filter layer and the like are formed on the thin glass substrate of the other layered plate, so as to obtain a counter substrate 2. A sealing material 4 for surrounding a display area is formed in a peripheral portion on the element substrate 1. These layered plates are bonded to each other with the sealing material 4 with the supporting substrates 9 facing outside (as shown in FIG. 10A).

In the same manner as in Embodiment 1, a UV (ultraviolet) curing type adhesive 6 is permeated into a peripheral portion between the layered plates by using a dispenser. The adhesive 6 is cured by using a UV irradiation device, so that the inside between the substrates can be sealed and isolated from the outside (as shown in FIG. 10B).

The supporting substrates 9 are removed by the chemical etching using hydrofluoric acid (as shown in FIG. 10C). Thereafter, in the same manner as in Embodiment 1, the breaking processing, the terminal exposure, the filling of a liquid crystal material, the sealing and the COG mounting are successively carried out, so as to complete the liquid crystal panel according to this embodiment (see FIG. 1).

In this embodiment, since the layered plate has a sufficiently large thickness, the mechanical strength can be attained on the fabrication line. Also, since the supporting substrates 9 have a sufficiently large thickness, they can be stably bonded to each other with the sealing material 4 sandwiched therebetween without being restricted in the applied temperature. Furthermore, in removing the supporting substrates 9 by the chemical etching after aligning the layered plates, the resin layer 5 can work as an etching stopper, and hence, the total thickness of the resin layer and the glass substrates can be made uniform.

Embodiment 5

In each of Embodiments 1 through 4, one liquid crystal panel is obtained from a pair of glass substrates. The present invention is applicable also to the case where a plurality of liquid crystal panels are obtained from a pair of mother glass substrates. In obtaining a plurality of liquid crystal panels from a pair of mother glass substrates, the number of breaking processing performed on the glass substrates is large, and therefore, the external stress applied to the glass substrates is large. According to this invention, however, sufficient strength against the external stress can be secured, and hence, the present invention can attain a remarkable effect in the application to the case where a plurality of liquid crystal panels are obtained from a pair of mother glass substrates. For example, since the product yield on the fabrication line can be increased, cost increase resulting from occurrence of defectives can be suppressed.

Embodiment 6

Figure 11:
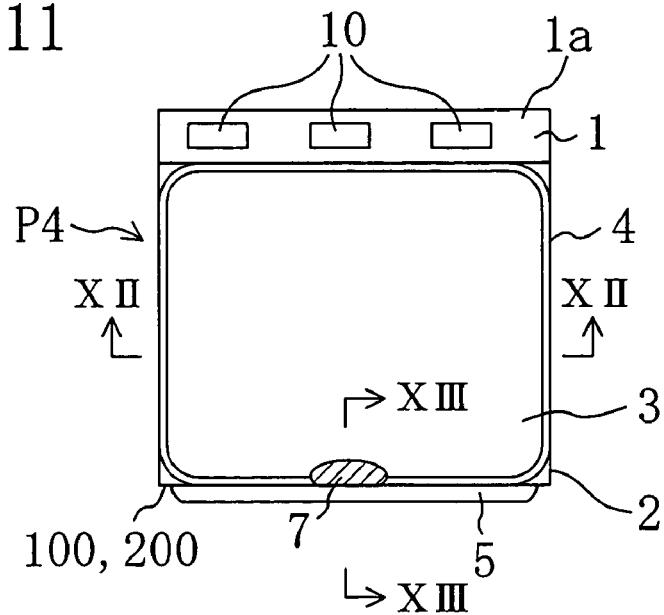
FIG. 11 is a plan view for schematically showing a liquid crystal panel P4 according to Embodiment 6.
Figure 12:
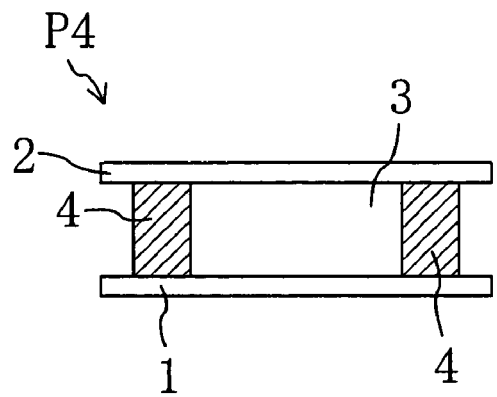
FIG. 12 is a cross-sectional view taken along line XII-XII of FIG. 11.
Figure 13:
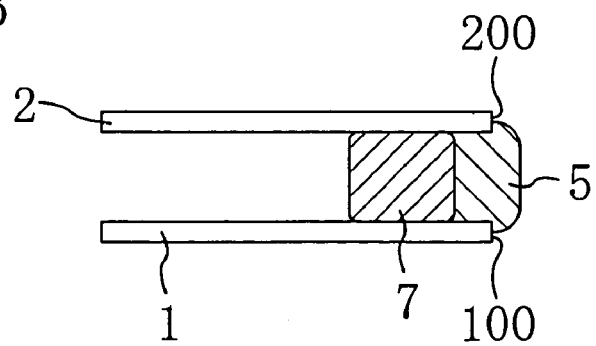
FIG. 13 is a cross-sectional view taken along line XIII-XIII of FIG. 11.

FIG. 11 is a plan view for schematically showing a liquid crystal panel P4 according to Embodiment 6. FIG. 12 is a cross-sectional view thereof taken along line XII-XII of FIG. 11, and FIG. 13 is a cross-sectional view thereof taken along line XIII-XIII of FIG. 11. This liquid crystal panel P4 includes, in a terminal portion 1a, a driving IC 10 mounted in the form of a bare chip on the liquid crystal panel P4 by the COG (Chip On Glass) method in the same manner as the liquid crystal panel P1 of Embodiment 1.

In the same manner as the liquid crystal panel P1 of Embodiment 1, the liquid crystal panel P4 has an element substrate 1 on which a switching element is formed, a counter substrate 2 disposed to oppose the element substrate 1 and a liquid crystal layer 3 interposed between the substrates 1 and 2. The substrates 1 and 2 are aligned with a sealing material 4 sandwiched therebetween.

The sealing material 4 has an injection port through which a liquid crystal material is filled, and the injection port is sealed with an end-sealing material 7. As shown in FIG. 13, a resin layer 5 is formed on end faces 100 and 200 of the substrates 1 and 2 in the vicinity of the end-sealing material 7. Although the distance (cell gap) between the substrates 1 and 2 is larger than the thickness of the substrates 1 and 2 in FIG. 13, the cell gap is typically approximately several sum while the thickness of the substrates 1 and 2 is not less than 0.15 mm and not more than 0.3 mm. Accordingly, the end faces 100 and 200 of the substrates 1 and 2 in the vicinity of the end-sealing material 7 can be substantially expressed as the end face of the liquid crystal panel P4.

The resin layer 5 may be formed on the whole end faces 100 and 200 or may be formed on part of the end faces 100 and 200. In this embodiment, the resin layer 5 is formed at least in portions of the end faces corresponding to the injection port. Thus, even when the end-sealing material 7 is shifted or peeled off due to impact applied on the fabrication line, the liquid crystal material can be prevented from leaking through the injection port.

Figure 14A:
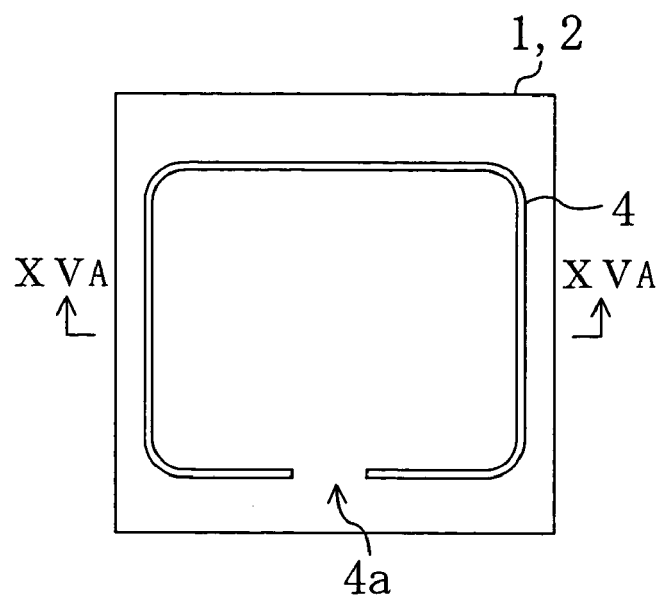
FIGS. 14A, 14B and 14C are plan views for schematically showing fabrication procedures for the liquid crystal panel P4.
Figure 14B:
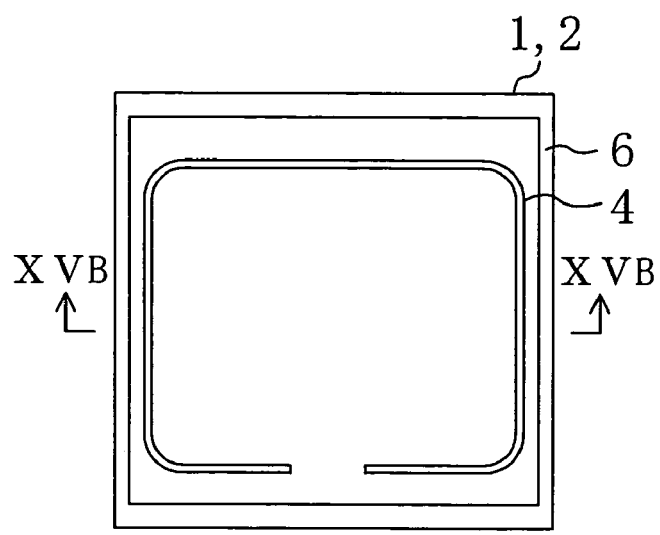
Figure 14C:
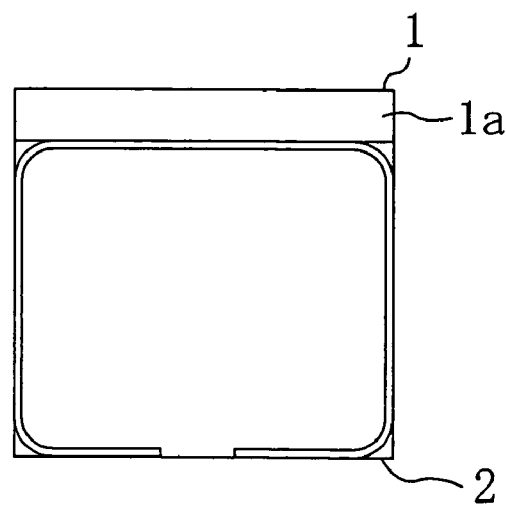
Figure 15A:
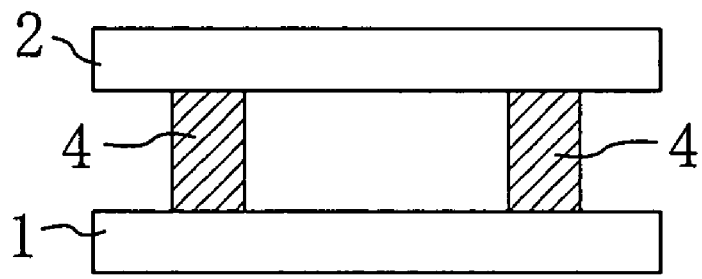
FIGS. 15A, 15B and 15C are cross-sectional views for schematically showing fabrication procedures for the liquid crystal panel P4.
Figure 15B:
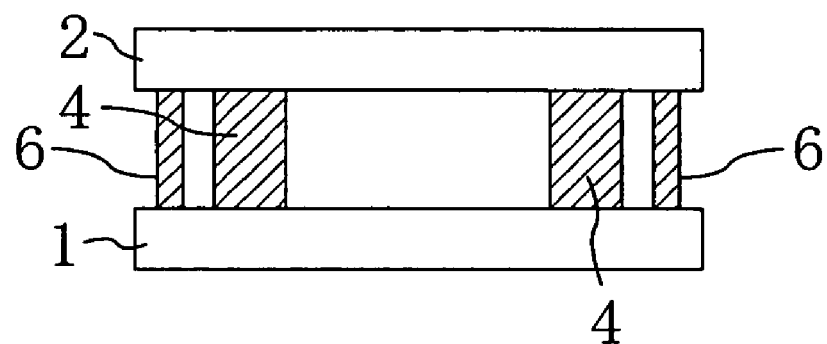
Figure 15C:
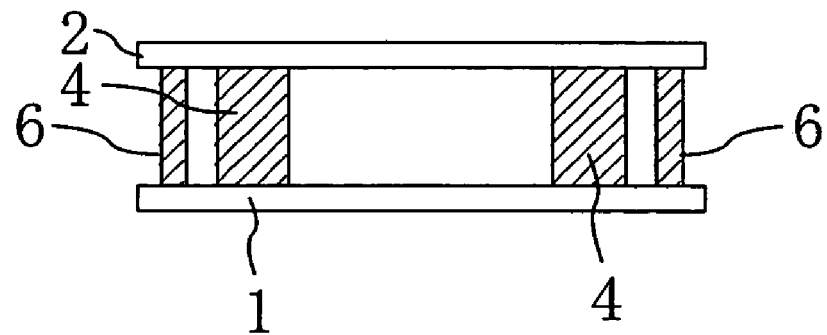

Next, the fabrication process for the liquid crystal panel P4 of this embodiment will be described with reference to the accompanying drawings. FIGS. 14A, 14B and 14C are plan views for schematically showing fabrication procedures for the liquid crystal panel P4. FIGS. 15A, 15B and 15C are cross-sectional views for schematically showing fabrication procedures for the liquid crystal panel P4. More specifically, FIGS. 15A and 15B are cross-sectional views taken along line XVA-XVA of FIG. 14A and line XVB-XVB of FIG. 14B, respectively.

First, in the same manner as in Embodiment 1, an element substrate 1 and a counter substrate 2 are obtained and these substrates 1 and 2 are aligned (as shown in FIGS. 14A and 15A). A UV (ultraviolet) curing type adhesive 6 is permeated into a peripheral portion between the substrates 1 and 2. The adhesive 6 is cured by using a UV irradiation device, so that the inside between the substrates can be sealed and isolated from the outside (as shown in FIGS. 14B and 15B). The substrates 1 and 2 are reduced in their thicknesses by the chemical etching in which the outer faces of the substrates 1 and 2 are exposed to hydrofluoric acid (as shown in FIG. 15C). The thickness reduction is performed until the thickness of each of the substrates 1 and 2 becomes not less than 0.1 mm and not more than 0.3 mm, in other words, until the total thickness of the aligned substrates becomes approximately not less than 0.2 mm and not more than 0.6 mm.

The aligned substrates 1 and 2 thus reduced in their thicknesses are subjected to the breaking processing so as to obtain a predetermined size, and a bonding portion with the adhesive 6 is removed. Also, an injection port 4a of the sealing material 4 is exposed on the end faces of the substrates 1 and 2. After the breaking processing, the terminal exposure is performed by removing a portion of the counter substrate opposing the terminal portion 1a of the element substrate 1 by breaking (as shown in FIG. 14C).

By utilizing capillarity under reduced pressure, a liquid crystal material is filled through the injection port 4a of the sealing material 4. Thus, a liquid crystal layer 3 is formed between the substrates 1 and 2. The liquid crystal material can be filled by the dispenser method or the dipping method. After filling the liquid crystal material, the injection port 4a is sealed with an end-sealing material 7. Specifically, a heat-curing type or UV curing type resin is applied on the injection port 4a by using a dispenser, and the resin is heated or irradiated with ultraviolet for curing. In this embodiment, the injection port 4a is sealed by applying a UV curing type sealer (for example, S-170 manufactured by Loctite) and curing it through UV irradiation.

Next, among the end faces of the substrates 1 and 2, end faces 100 and 200 in the vicinity of the end-sealing material 7 are coated with a resin by the dipping method. The resin is subjected to UV irradiation performed at 350 mJ, so as to form a resin layer 5 with a thickness not less than 1 μm and not more than 100 μm and preferably not less than 2 μm and not more than 50 μm. Thereafter, a driving IC 10 is mounted in the form of a bare chip on the inner face of the terminal portion 1a of the element substrate 1. Thus, the liquid crystal panel P4 of this embodiment is completed (see FIG. 11).

Although the UV (ultraviolet) curing type resin is used in this embodiment, a heat-curing type resin may be used for forming the resin layer 5. Examples of the resin are organic resins such as an epoxy resin, a PES (polyether sulfone) resin, a urethane resin, and a vinyl acetate resin. The resin layer 5 is mainly made of an organic resin. Alternatively, a hybrid material highly adhesive to the glass substrate is preferably used instead of the organic resin. When the hybrid material is used, the dynamic characteristics such as an elastic modulus and hardness are improved, and the heat resistance and the chemical resistance are remarkably improved. The hybrid material is composed of inorganic colloid particles and an organic binder resin. For example, the hybrid material is composed of inorganic colloid particles of silica or the like and an organic binder resin such as an epoxy resin, a polyurethane acrylate resin or a polyester acrylate resin.

According to this embodiment, in the fabrication process for the liquid crystal panel P4, the stress applied to the end faces of the panel can be reduced in, for example, the following procedures, and hence, the substrates can be prevented from cracking and the yield can be improved:

1) Cleaning procedure: For example, when the liquid crystal panel placed within a cassette is brought into contact with the cassette owing to vibration caused for the cleaning, or when the liquid crystal panel is taken out of the cassette.

2) Inspection procedure: For example, when the liquid crystal panel is set on test equipment.

3) Polarizer sticking procedure: When the liquid crystal panel is set on a polarizer sticking system.

4) Mounting procedure: When the liquid crystal panel is set on a mounting device or when a pressing tool comes into contact with the liquid crystal panel (the terminal portion, in particular).

5) Assembling procedure: When the liquid crystal panel is assembled in a unit.

Embodiment 7

Figure 16:
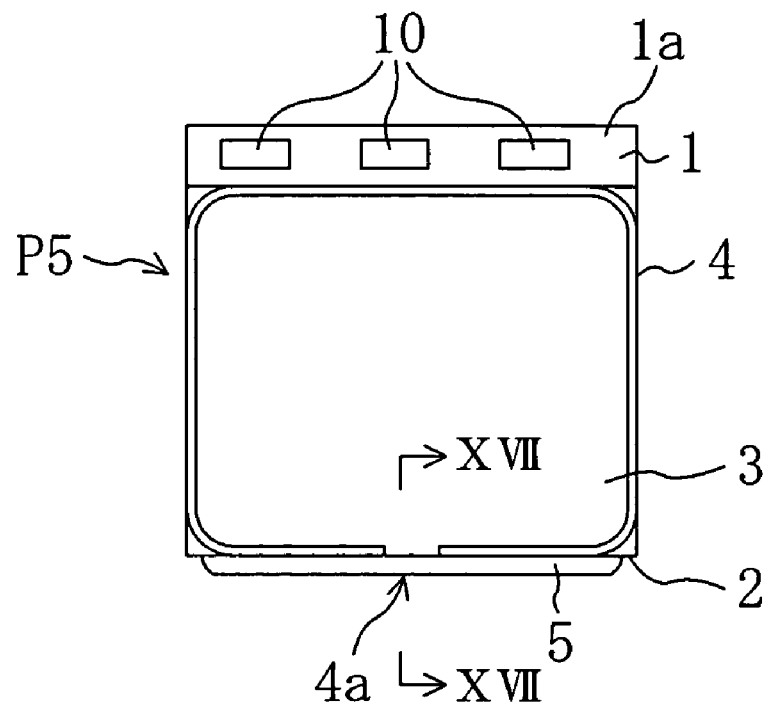
FIG. 16 is a plan view for schematically showing a liquid crystal panel P5 according to Embodiment 7.
Figure 17:
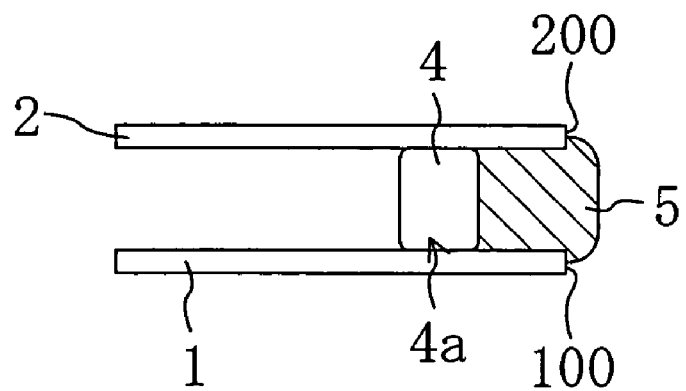
FIG. 17 is a cross-sectional view taken along line XVII-XVII of FIG. 16.

FIG. 16 is a plan view for schematically showing a liquid crystal panel P5 according to Embodiment 7. FIG. 17 is a cross-sectional view thereof taken along line XVII-XVII of FIG. 16.

The liquid crystal panel P5 of this embodiment is different from the liquid crystal panel P4 of Embodiment 6 in the injection port 4a of the sealing material 4 sealed not with the end-sealing material but with a resin layer 5. In this embodiment, the injection port 4a can be sealed by forming the resin layer 5, and therefore, the procedure for forming the end-sealing material can be omitted, resulting in suppressing increase of the number of procedures. Accordingly, the efficiency can be increased and the cost can be lowered. The liquid crystal panel P5 of this embodiment can be fabricated in the same manner as described in Embodiment 6 except that the procedure for forming the end-sealing material is omitted, and hence, the description of the fabrication method will be herein omitted.

Embodiment 8

Although the resin layer 5 is formed merely on the end faces 100 and 200 in the vicinity of the end-sealing material 7 in the liquid crystal panel P4 or P5 of Embodiment 6 or 7, the resin layer 5 may be formed on the other end faces. Also, the resin layer 5 may be formed on the outer face (namely, the face on the opposite side to the liquid crystal layer 3) of the element substrate 1 and/or the counter substrate 2. The resin layer is formed by, for example, applying the resin on the outer faces of the substrates 1 and 2 by a spin coater, the dipping method or the dispenser method and curing the applied resin.

In a liquid crystal panel of this embodiment, a resin layer with a thickness of 30 μm is formed on three end faces, namely, the end face in the vicinity of the end-sealing material and the end faces adjacent to this end face. Thus, even when stress is applied to the three end faces of the liquid crystal panel, the edges of the liquid crystal panel can be prevented from being damaged.

Furthermore, a resin layer with a thickness of 30 μm is formed also on the outer faces of the element substrate and the counter substrate of the liquid crystal panel of this embodiment. Since the resin layer is formed on the outermost faces of the display panel, the panel can attain more sufficient strength against external stress. Also, as compared with the case where the both faces of the respective two glass substrates are reinforced, the total thickness of the resin layer can be reduced, so as to realize a small thickness and a small weight of the display panel. Furthermore, since this display panel can attain mechanical strength sufficient for resisting compact applied on the fabrication line, it is suitable to the mass production using the fabrication line.

Embodiment 9

Figure 18:
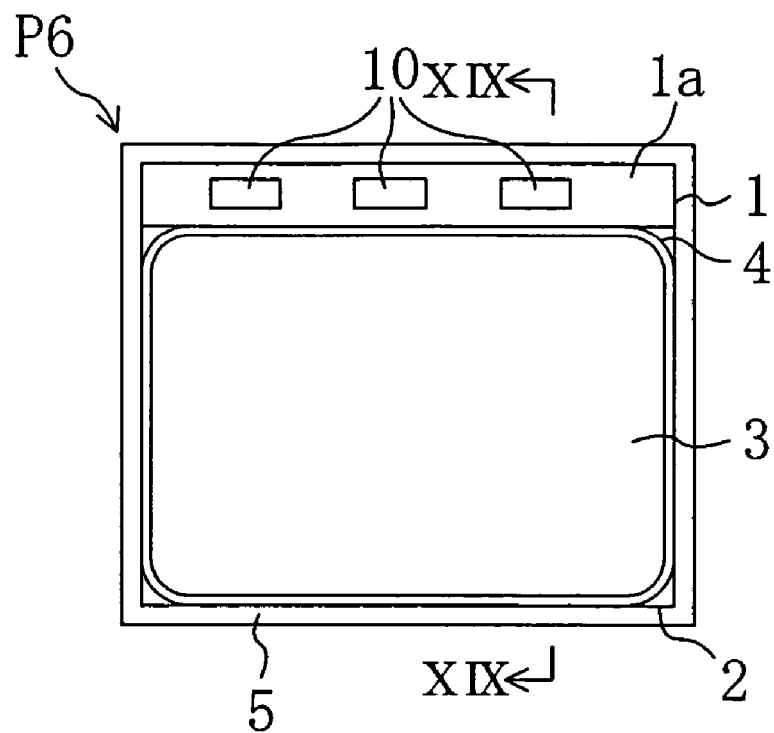
FIG. 18 is a plan view for schematically showing a liquid crystal panel according to Embodiment 9.
Figure 19:
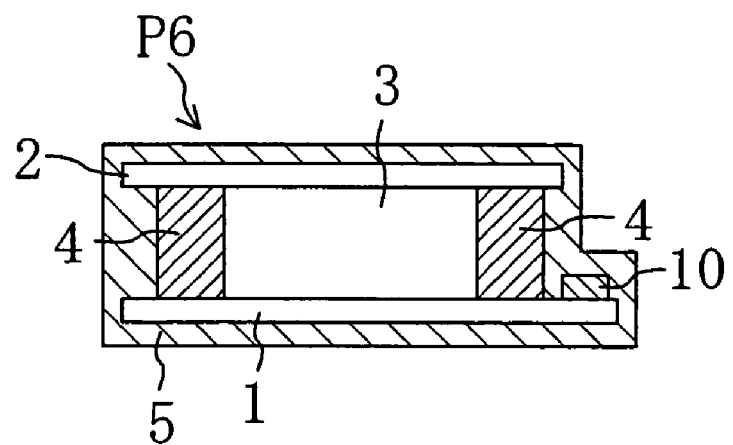
FIG. 19 is a cross-sectional view taken along line XIX-XIX of FIG. 18.

FIG. 18 is a plan view for schematically showing a liquid crystal panel P6 according to Embodiment 9, and FIG. 19 is a cross-sectional view thereof taken along line XIX-XIX of FIG. 18. As shown in FIG. 19, the liquid crystal panel P6 of this embodiment is covered with a resin on its whole faces. Thus, high mechanical strength and high reliability can be attained. Also, as compared with the case where the both faces of the respective two glass substrates are reinforced, the total thickness of the display panel can be reduced, so as to realize a small thickness and a small weight of the display panel.

Figure 20A:
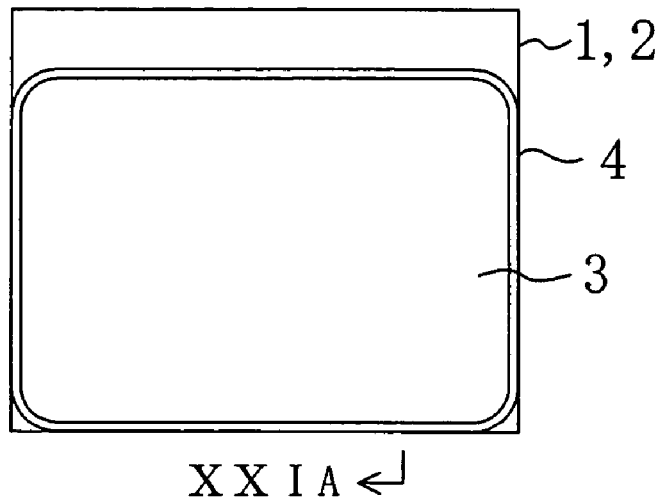
FIGS. 20A and 20B are plan views for schematically showing fabrication procedures for a liquid crystal panel P6 according to Embodiment 10.
Figure 20B:
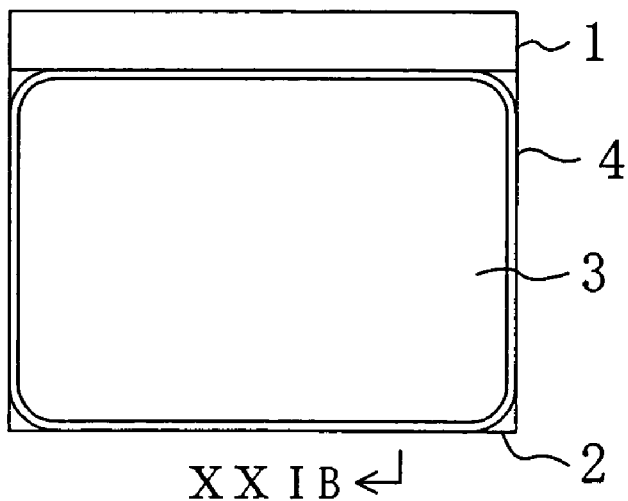
Figure 21A:
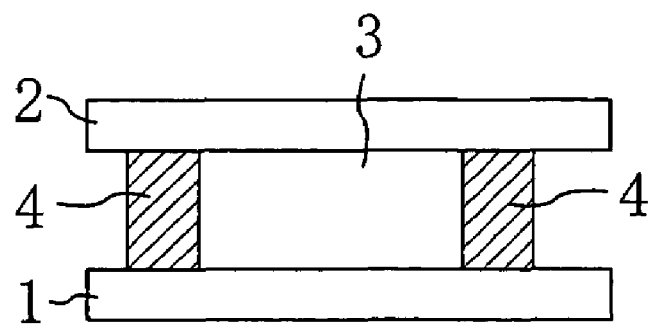
FIGS. 21A, 21B and 21C are cross-sectional views for schematically showing fabrication procedures for the liquid crystal panel P6, and specifically.
Figure 21B:
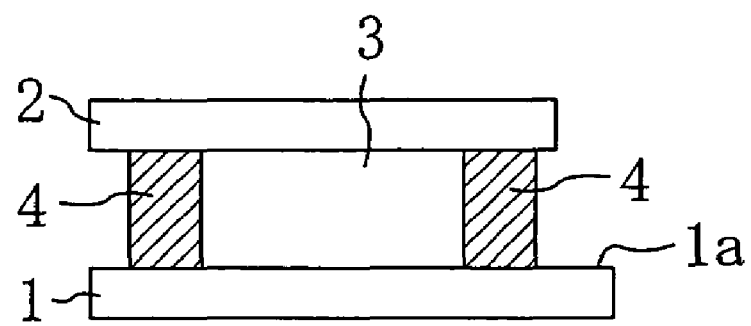
Figure 21C:
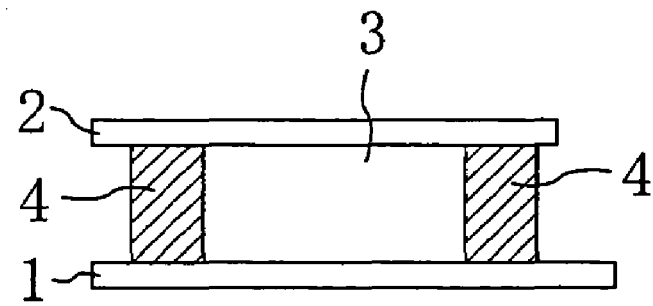

The fabrication process for the liquid crystal panel P6 of this embodiment will now be described with reference to the accompanying drawings. FIGS. 20A and 20B are plan views for schematically showing fabrication procedures for the liquid crystal panel P6, and FIGS. 21A, 21B and 21C are cross-sectional views for schematically showing fabrication procedures for the liquid crystal panel P6. More specifically, FIGS. 21A and 21B are cross-sectional views taken along line XXIA-XXIA of FIG. 20A and line XXIB-XXIB of FIG. 20B, respectively.

First, in the same manner as in Embodiment 6, a TFT device and the like are formed on a soda glass substrate with a thickness of 0.4 mm, so as to obtain an element substrate 1. Also, a color filter layer and the like are formed on another soda glass substrate with a thickness of 0.4 mm, so as to obtain a counter substrate 2.

In the same manner as in Embodiment 3, a sealing material 4 for surrounding a display area is formed in a peripheral portion on the element substrate 1 by the screen printing or the like. After dropping a liquid crystal material on the counter substrate 2, the substrates 1 and 2 are aligned with the sealing material 4 sandwiched therebetween. While pressing the substrates 1 and 2 to each other, the substrates 1 and 2 are irradiated with ultraviolet so as to cure the sealing material 4. Thus, the substrates 1 and 2 are bonded to each other (as shown in FIGS. 20A and 21A). In this embodiment, a liquid crystal layer 3 is formed at the same time as the alignment of the substrates 1 and 2.

After subjecting the liquid crystal panel P6 to the breaking processing to obtain a predetermined size, the terminal exposure is carried out. Thus, the inner face of a terminal portion 1a of the element substrate 1 is exposed (as shown in FIGS. 20B and 21B).

The substrates 1 and 2 are reduced in their thicknesses by the physical polishing. Specifically, the outer faces of the substrates 1 and 2 are polished by using, for example, a polishing machine. This thickness reduction is performed until the thickness of each of the substrates 1 and 2 becomes not more than 0.1 mm and not less than 0.3 mm, in other words, until the total thickness of the aligned substrates becomes approximately not less than 0.2 mm and not more than 0.6 mm (as shown in FIG. 21C). A bump of a driving IC 10 is bonded to the terminal of the element substrate 1 so that the driving IC 10 can be mounted in the form of a bare chip on the liquid crystal panel P6.

Next, for example, an acrylic resin is applied on the whole outer face of the liquid crystal panel P6 by the dipping method. The resultant is heated at approximately 200° C., so as to form a resin layer 5 with a thickness of 20 µm.

Although the heat-curing type resin is used in this embodiment, a UV (ultraviolet) curing type resin may be used for forming the resin layer 5. Examples of the resin are organic resins such as an epoxy resin, a PES (polyether sulfone) resin, a urethane resin, and a vinyl acetate resin. The resin layer 5 is mainly made of an organic resin. Alternatively, a hybrid material highly adhesive to the glass substrate is preferably used instead of the organic resin. When the hybrid material is used, the dynamic characteristics such as an elastic modulus and hardness are improved, and the heat resistance and the chemical resistance are remarkably improved. The hybrid material is composed of inorganic colloid particles and an organic binder resin. For example, the hybrid material is composed of inorganic colloid particles of silica or the like and an organic binder resin such as an epoxy resin, a polyurethane acrylate resin or a polyester acrylate resin.

In the case where the thicknesses of the substrates 1 and 2 are reduced by the chemical etching as in Embodiment 4, a UV (ultraviolet) curing type adhesive is permeated into a peripheral portion between the substrates 1 and 2 by using a dispenser. The adhesive is cured by using a UV irradiation device, so that the inside between the substrates can be sealed and isolated from the outside.

In this embodiment, the breaking processing and the terminal exposure are carried out before polishing the glass substrates 1 and 2. In other words, the polishing is performed while the total thickness of the substrates 1 and 2 is still large. Accordingly, cracks can be prevented from being caused in the substrates 1 and 2 in the breaking processing, and the terminal portion 1a can be prevented from being spoiled in the terminal exposure. Also, since the thickness reduction is performed after the breaking processing, the occurrence of defectives can be suppressed as compared with the case where glass substrates having reduced thicknesses are subjected to the breaking processing.

In this embodiment, the filling and sealing procedures are performed before reducing the thicknesses of the glass substrates 1 and 2, and hence, the substrates can be prevented from being cracked due to external stress. As a result, a thin film tempered glass substrate can be easily fabricated without lowering the yield.

In obtaining a plurality of liquid crystal panels from a pair of mother glass substrates, the number of breaking processing performed on the glass substrates is large, and therefore, the external stress applied to the glass substrates is large. According to this embodiment, however, in the case where a large number of liquid crystal panels are obtained from mother glass substrates, the breaking processing for exposing the injection ports and obtaining each cell (namely, the terminal exposure) can be carried out in one step, and therefore, the stress applied during the breaking processing can be largely reduced.

According to this embodiment, in the fabrication process for the liquid crystal panel P6, the stress applied to the end face of the panel can be reduced in, for example, the following procedures, and hence, the substrates can be prevented from cracking and the yield can be improved:

1) Cleaning procedure: For example, when the liquid crystal panel placed within a cassette is brought into contact with the cassette owing to vibration caused for the cleaning, or when the liquid crystal panel is taken out of the cassette.

2) Inspection procedure: For example, when the liquid crystal panel is set on test equipment.

3) Polarizer sticking procedure: When the liquid crystal panel is set on a polarizer sticking system.

4) Assembling procedure: When the liquid crystal panel is assembled in a unit.

Although the driving IC 10 is mounted by the COG method before applying the resin material on the inner face of the terminal portion 1a in this embodiment, the driving IC 10 may be mounted after applying the resin material on the inner face of the terminal portion 1a and before curing the resin material. Alternatively, the driving IC 10 may be mounted by the COG method before aligning the element substrate 1 and the counter substrate 2.

TEST EXAMPLE: DROP TEST

Assuming that a display panel is dropped from the top of a desk to the floor, various display panels are dropped from a height of 70 cm to the top of a desk and damages of the edges of the display panels are checked. As the display panels to be examined, three cells each of the liquid crystal panels of Embodiments 6 through 9 are used. The size of each liquid crystal panel is 40 mm×50 mm. Each liquid crystal panel is dropped with its glass substrate face being vertical to the top of the desk and with the terminal portion 1a facing upward. With respect to the liquid crystal panels according to Embodiments 6 through 8, each liquid crystal panel is dropped with its end face in the vicinity of the injection port 4a of the sealing material 4 facing downward.

As a comparative example, a display panel in which a resin layer is formed merely on the outer faces of the glass substrates is tested by a similar drop test.

As a result, none of the liquid crystal panels according to Embodiments 6 through 9 is damaged in their edges (the edges opposite to the terminal portions 1a). In contrast, the edge of the liquid crystal panel of the comparative example is damaged.

According to this invention, a small thickness and a small weight of a display panel can be realized freely from restrictions on the fabrication line.

What is claimed is:

1. A display panel comprising:
   a pair of glass substrates each having a thickness not less than 0.15 mm and not more than 0.3 mm; and
   a sealing material for bonding the pair of glass substrates to each other,
   wherein only a single resin layer with a thickness of 2-50 µm is formed on and directly contacting an outer face of at least one of the pair of glass substrates in order to strengthen the substrate(s) against breakage, so that no resin layer other than the single resin layer is formed on the outer face of said one of the pair of glass substrates.

2. The display panel of claim 1, wherein the resin layer is mainly made of an organic resin.

3. The display panel of claim 1, wherein the resin layer includes a hybrid material composed of inorganic colloid particles and an organic binder resin.

4. The display panel of claim 1, wherein one of the pair of glass substrates has a terminal portion on its inner face and outside the sealing material, and another resin layer is formed on the terminal portion.

5. The display panel of claim 4, wherein an integrated circuit chip is mounted on the terminal portion, and at least a connection part between the terminal and the integrated circuit chip is covered with the second resin.

6. The display panel of claim 1, wherein a polarizing layer is formed on an inner face of at least one of the pair of glass substrates.

7. A method for fabricating the display panel of claim 1, comprising the steps of:

aligning a pair of glass substrates each with a thickness of 0.3 mm or more with the sealing material sandwiched therebetween;

reducing thicknesses of the pair of aligned glass substrates until each thickness becomes not less than 0.15 mm and not more than 0.3 mm; and forming the resin layer on the outer face of at least one of the pair of glass substrates whose thicknesses have been reduced.

8. The method for fabricating the display panel of claim 7, wherein the step of reducing thicknesses includes a sub-step of performing chemical etching or physical polishing.

* * * * *